(12) United States Patent
Okazaki et al.

(10) Patent No.: US 9,041,160 B2
(45) Date of Patent: *May 26, 2015

(54) SEMICONDUCTOR INTEGRATED CIRCUIT DEVICE

(71) Applicant: Rohm Co., Ltd., Kyoto (JP)

(72) Inventors: Mitsuru Okazaki, Kyoto (JP); Youichi Kajiwara, Kyoto (JP); Naoki Takahashi, Kyoto (JP); Akira Shimizu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/307,869

(22) Filed: Jun. 18, 2014

(65) Prior Publication Data

US 2014/0299970 A1  Oct. 9, 2014

Related U.S. Application Data

(63) Continuation of application No. 13/240,054, filed on Sep. 22, 2011, now Pat. No. 8,786,092, which is a continuation-in-part of application No. 11/917,186, filed as application No. PCT/JP2006/311805 on Jun. 13, 2006, now abandoned.

(30) Foreign Application Priority Data

Jun. 17, 2005 (JP) ................................. 2005-177140

(51) Int. Cl.
*H01L 29/06* (2006.01)
*H01L 23/50* (2006.01)
*H01L 23/528* (2006.01)

(52) U.S. Cl.
CPC .......... *H01L 29/0603* (2013.01); *H01L 23/528* (2013.01); *H01L 23/5283* (2013.01); *H01L 23/50* (2013.01); *H01L 2924/0002* (2013.01)

(58) Field of Classification Search
USPC ......... 257/260, 620, 690, 693, 701, 762, 782, 257/786
See application file for complete search history.

(56) References Cited

U.S. PATENT DOCUMENTS 5,391,920 A  2/1995  Tsuji
5,430,325 A  7/1995  Sawada et al.
(Continued)

FOREIGN PATENT DOCUMENTS

EP  339871 A2  11/1989
JP  59220957  12/1964
(Continued)

OTHER PUBLICATIONS

International Search Report for International Application No. PCT/2006/311805, dated Sep. 12, 2006.

*Primary Examiner* — Matthew W Such
*Assistant Examiner* — David Spalla
(74) *Attorney, Agent, or Firm* — Fish & Richardson P.C.

(57) ABSTRACT

A semiconductor integrated circuit device includes: a rectangular shaped semiconductor substrate; a metal wiring layer formed on or over the semiconductor substrate; and a passivation layer covering the metal wiring layer. A corner non-wiring region where no portion of the metal wiring layer is formed is disposed in a corner of the semiconductor substrate. A slit is formed in a portion of the metal wiring layer which is close to the corner of the semiconductor substrate. The passivation layer includes a first passivation layer which is formed on the metal wiring layer and a second passivation layer which is formed on the first passivation layer. The first passivation layer is formed of a material that is softer than a material of the second passivation layer.

17 Claims, 4 Drawing Sheets

(56) References Cited

U.S. PATENT DOCUMENTS

| | | |
|---|---|---|
| 5,491,352 A | 2/1996 | Tsuji |
| 5,583,381 A * | 12/1996 | Hara et al. .................... 257/775 |
| 6,091,156 A | 7/2000 | Kinoshita |
| 6,570,243 B1 | 5/2003 | Hagihara |
| 7,057,296 B2 | 6/2006 | Hung et al. |
| 7,202,550 B2 | 4/2007 | Fu et al. |
| 7,906,430 B2 | 3/2011 | Umemoto et al. |
| 8,786,092 B2 * | 7/2014 | Okazaki et al. ............... 257/773 |
| 2003/0063519 A1 | 4/2003 | Okuda et al. |
| 2004/0012914 A1 | 1/2004 | Chu et al. |
| 2005/0093176 A1 | 5/2005 | Hung et al. |
| 2005/0179213 A1 | 8/2005 | Huang et al. |
| 2006/0278956 A1 | 12/2006 | Cadouri |
| 2011/0115057 A1 | 5/2011 | Harn et al. |

FOREIGN PATENT DOCUMENTS

| | | |
|---|---|---|
| JP | 59-161852 | 9/1984 |
| JP | 05-136136 | 6/1993 |
| JP | 2001-168093 | 6/1993 |
| JP | 05-251556 | 9/1993 |
| JP | 05-283540 | 10/1993 |
| JP | 10-079466 | 3/1998 |

* cited by examiner

US 9,041,160 B2

SEMICONDUCTOR INTEGRATED CIRCUIT DEVICE

CROSS-REFERENCE TO RELATED APPLICATIONS

This application is a continuation of U.S. patent application Ser. No. 13/240,054, filed Sep. 22, 2011, which is a Continuation-In-Part of U.S. patent application Ser. No. 11/917,186, filed on Dec. 11, 2007, which is a U.S. National Phase Application of PCT/JP2006/311805, filed Jun. 13, 2006, which claims the benefit of Japanese Patent Application No. 2005-177140, filed Jun. 17, 2005, the entire contents of which are incorporated herein by reference.

BACKGROUND OF THE INVENTION

1. Field of the Invention

The present invention relates to a semiconductor integrated circuit device, and more particularly to improvement of the reliability thereof in a temperature cycle test.

2. Description of Related Art

A temperature cycle test is conventionally imposed as one type of reliability evaluation test on semiconductor integrated circuit devices in which high reliability is required in varying use environments (e.g., a serial control LED (light emitting diode) driver for automobiles). A temperature cycle test is a test in which a semiconductor integrated circuit device is tested for reliability by being exposed alternately to a high and a low temperature (e.g., +150° C. and −65° C.) repeatedly at predetermined intervals.

When a conventional semiconductor integrated circuit device is subjected to the temperature cycle test as described above, thermal stress resulting from differences in thermal expansion coefficient among an element forming region, a metal wiring layer, and a passivation layer may produce a crack (exfoliation) in the passivation layer, causing even the metal wiring layer right under the passivation layer to exfoliate together in the worst case. This leads to degraded reliability and reduced yields. In particular, elongate chips such as display drivers and sensors are liable to be seriously affected.

As a solution to the above described problem, a semiconductor integrated circuit device has conventionally been disclosed and proposed in which a metal wiring layer and a passivation layer have elevations and depressions (slits) formed thereon (see JP-A-H05-283540, hereinafter referred to as Patent Literature 1).

As another conventional art related to the present invention, a semiconductor chip in which a dummy pattern is formed between an identification area including an identification mark and a dicing line has been disclosed and proposed (see JP-A-H05-251556 filed by the applicant of the present application, hereinafter referred to as Patent Literature 2).

With the conventional art of Patent Literature 1, it is indeed possible to disperse thermal stress to prevent development of cracks in the passivation layer. However, the conventional art of Patent Literature 1 is disadvantageous in that it requires an extra process for forming elevations and depressions on the metal wiring layer and the passivation layer (more specifically, a process for forming elevations and depressions on an interlayer insulating film laid immediately under the metal wiring layer), and this invites reduced productivity and yields.

The conventional art of Patent Literature 2 simply aims at reducing exfoliation during the dicing of a semiconductor chip and the resulting identification errors. Thus, it in no way helps prevent development of cracks in a passivation layer during a temperature cycle test.

SUMMARY OF THE INVENTION

An object of the present invention is to provide a highly reliable semiconductor integrated circuit device.

To achieve the above object, according to the present invention, a semiconductor integrated circuit device includes: a rectangular shaped semiconductor substrate; a metal wiring layer formed on or over the semiconductor substrate; and a passivation layer covering the metal wiring layer. A corner non-wiring region where no portion of the metal wiring layer is formed is disposed in a corner of the semiconductor substrate. A slit is formed in a portion of the metal wiring layer which is close to the corner of the semiconductor substrate. The passivation layer includes a first passivation layer which is formed on the metal wiring layer and a second passivation layer which is formed on the first passivation layer. The first passivation layer is formed of a material that is softer than a material of the second passivation layer.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

<Embodiments>

Figure 1A:
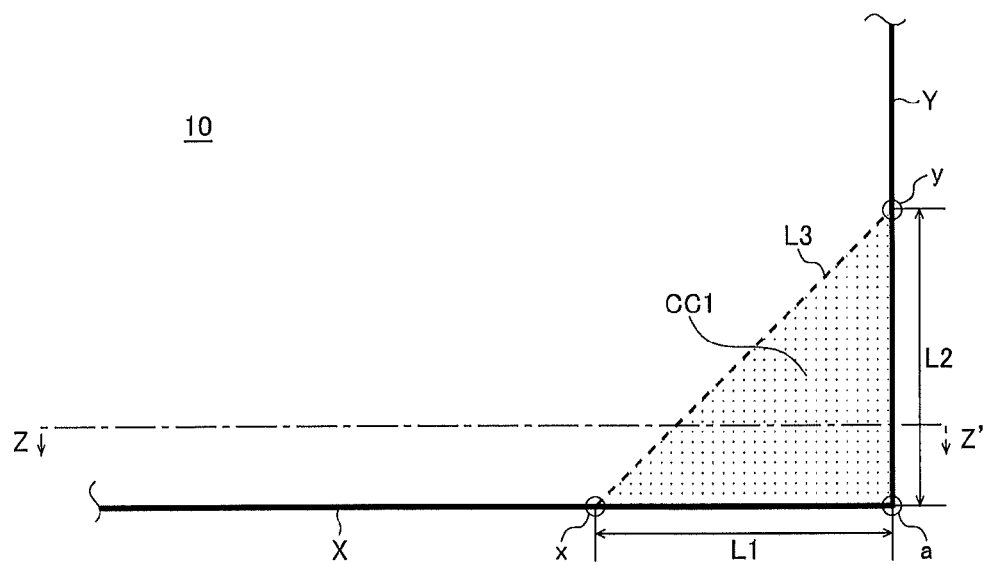
[FIG. 1A] A top view showing a semiconductor integrated circuit device according to a first embodiment of the present invention.
Figure 1B:
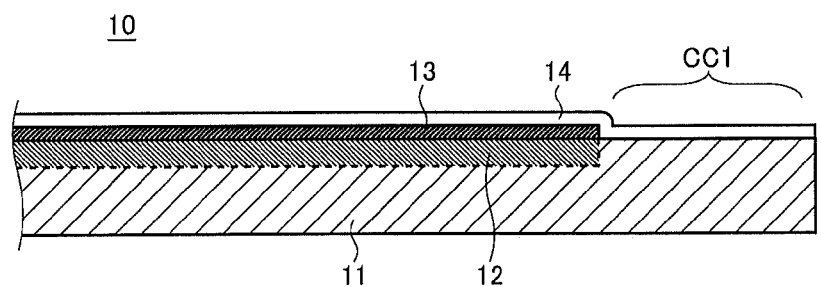
[FIG. 1B] A sectional view showing the semiconductor integrated circuit device according to the first embodiment of the present invention.

FIG. 1A is a top view and FIG. 1B is a sectional view taken along line Z-Z' in FIG. 1A, both showing a semiconductor integrated circuit device according to a first embodiment of the present invention.

As shown in FIG. 1A, the semiconductor integrated circuit device 10 of this embodiment is a semiconductor chip cut apart along prescribed dicing lines, and dividing it apart gives it four corners and four edges each connecting two adjoining corners. FIG. 1A shows, of all these corners and edges, only one corner "a" and two edges X and Y extending from it in mutually perpendicular directions.

As shown in FIG. 1B, in the semiconductor integrated circuit device 10 of this embodiment, an element forming region (impurity diffusion region) 12 is formed on a semiconductor substrate 11 cut out in a rectangular shape, and further on top a metal wiring layer 13 and then a passivation layer 14 are formed. The semiconductor substrate 11 is cut out so that one side thereof is at least two times (more specifically, at least five times) as long as another side that is perpendicular to that one side. The semiconductor integrated circuit device 10 is a display driver or a sensor device, and thus, in the element forming region 12 thereof, a plurality of display driver circuits or sensor circuits are formed. Though not shown in the figure, in the semiconductor integrated circuit device 10 of this embodiment, an interlayer insulating film, an element separating region, etc. are also formed.

The semiconductor substrate 11 may be a silicon substrate. A metal having high electric conductivity such as aluminum, copper, or gold is preferable as the material of the metal wiring layer 13. As the material of the passivation layer 14 that covers and protects the element forming region 12 and the metal wiring layer 13, polyimide resin, which is an electrically insulating material, may be used.

Figure 2A:
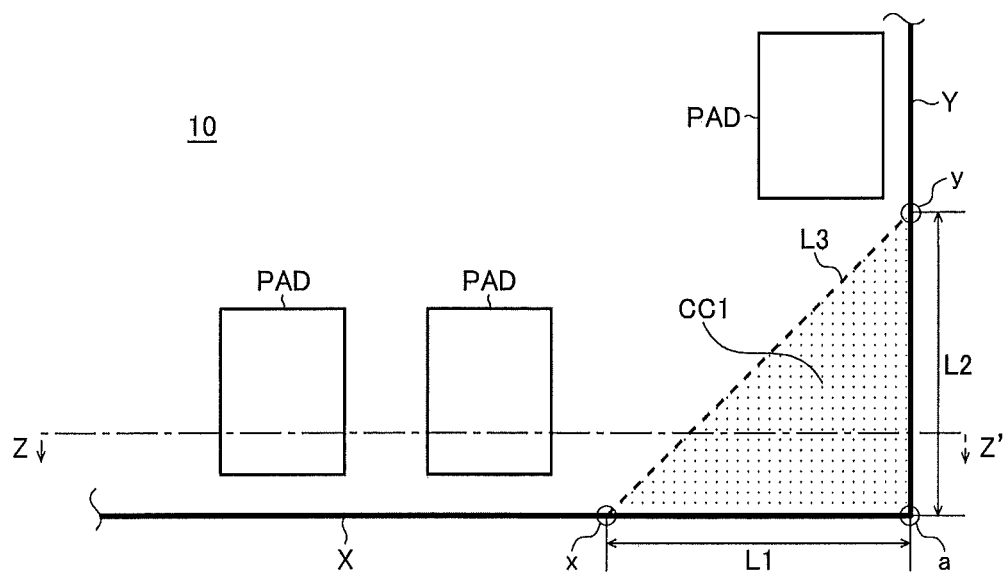
[FIG. 2A] A top view showing a semiconductor integrated circuit device according to a second embodiment of the present invention.
Figure 2B:
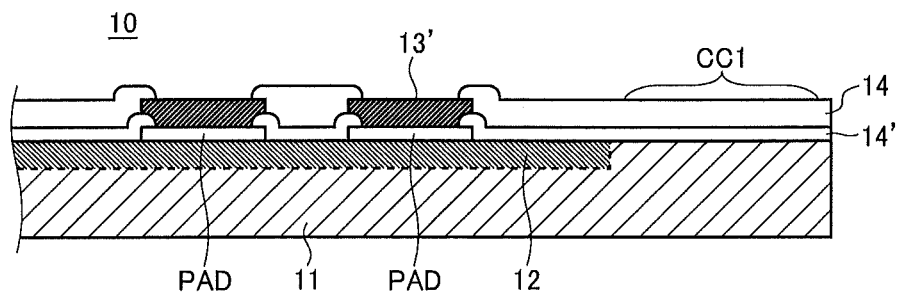
[FIG. 2B] A sectional view showing the semiconductor integrated circuit device according to the second embodiment of the present invention.

Herein, the metal wiring layer 13 is assumed to include in its concept a rewiring layer 13' as shown in FIG. 2B (a sectional view showing a semiconductor integrated circuit device according to a second embodiment of the present invention). The passivation layer 14 is assumed to include in its concept an insulating layer 14' made of a silicon oxide (e.g., $SiO_2$) or a silicon nitride (e.g., SiN) in addition to the already mentioned passivation layer 14 made of polyimide resin or the like.

Here, as shown in FIGS. 1A and 1B, in order to improve its reliability in a temperature cycle test, the semiconductor integrated circuit device 10 has, in each of the four corners thereof (areas where thermal stress is liable to concentrate), a corner non-wiring region CC1 where the passivation layer 14 is formed immediately on the semiconductor substrate 11.

More specifically, each corner non-wiring region CC1 in this embodiment is a triangular region enclosed by a first line L1 connecting a corner "a" and a point x located on an edge X, a second line L2 connecting the corner "a" and a point y located on another edge Y, and a third line L3 connecting the points x and y (the dotted area in FIG. 1A). Inside this region, no portion of the metal wiring layer 13, which is greatly different in thermal expansion coefficient from the passivation layer 14, is formed.

Although only the corner "a" is shown in FIG. 1A, a corner non-wiring region as described above is formed in each of the other three corners as well.

By forming a corner non-wiring region CC1 in each of the four corners of the semiconductor integrated circuit device 10 as described above, the difference in thermal expansion coefficient between the passivation layer 14 and a layer immediately thereunder can be minimized. Thus, it is possible to reduce the thermal stress itself applied to the passivation layer 14, and thereby to reduce the development of cracks therein.

However, quite naturally, an excessively large corner non-wiring region CC1, even though effective in reducing cracks, leads to an unduly low element density. To prevent this, it is preferable that the corner non-wiring region CC1 be given a minimum size necessary to appropriately prevent cracks in the passivation layer 14. For example, the first and second lines L1 and L2 may be designed to be about 250 μm long. It should be noted that the size mentioned above is only an example and the size of the corner non-wiring region CC1 may be appropriately adjusted according to factors such as the material and thickness of the passivation layer 14.

The present invention may be carried out in any manner other than specifically described above as embodiments, and permits any variations and modifications within the spirit thereof.

For example, although it is assumed in the embodiments described above that the first and second lines L1 and L2 that determine the corner non-wiring region CC1 have the same length, the configuration of the present invention is not meant to be limited to this, but the two lines may have different lengths.

Figure 3A:
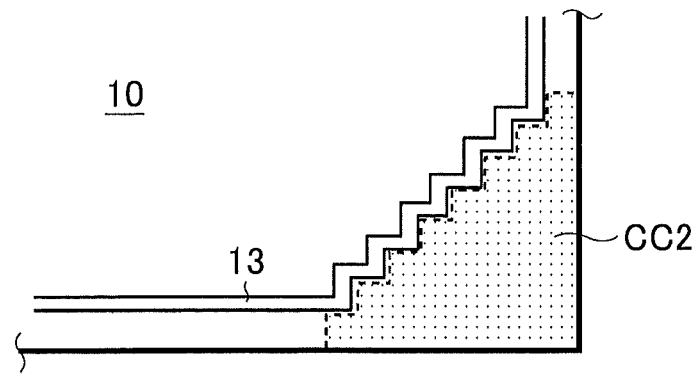
[FIG. 3A] A top view showing a semiconductor integrated circuit device according to a third embodiment of the present invention (a first layout example)
Figure 3B:
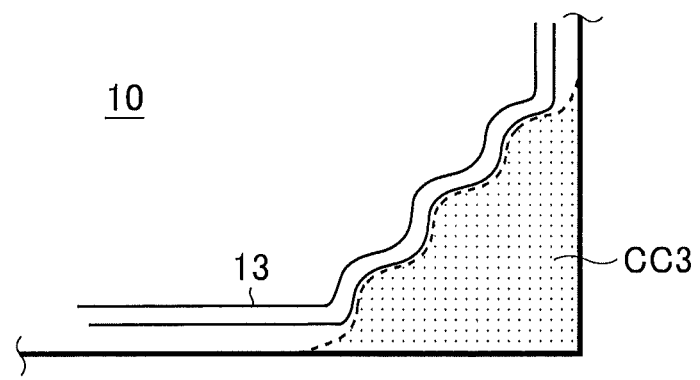
[FIG. 3B] A top view showing a semiconductor integrated circuit device according to the third embodiment of the present invention (a second layout example)
Figure 3C:
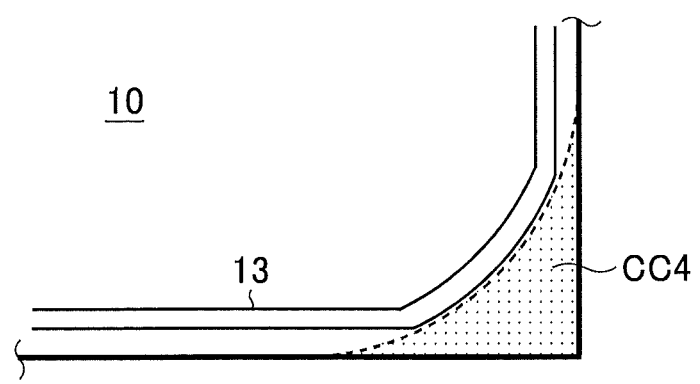
[FIG. 3C] A top view showing a semiconductor integrated circuit device according to the third embodiment of the present invention (a third layout example)

Also, though it is assumed in the embodiments described above that the corner non-wiring region CC1 has a triangular shape, this is not meant to limit the shape of the corner non-wiring region CC1, but any shape is permissible as long as concentration of thermal stress can be alleviated. For example, the corner non-wiring region CC1 may be enclosed by the first and second lines L1 and L2, and instead of the third line L3, a series of straight lines, a free curve, or a circular arc as shown in FIGS. 3A, 3B, and 3C, respectively (the dotted areas in the figures), the figures each being a top view showing a semiconductor integrated circuit device according to a third embodiment of the present invention.

Figure 4A:
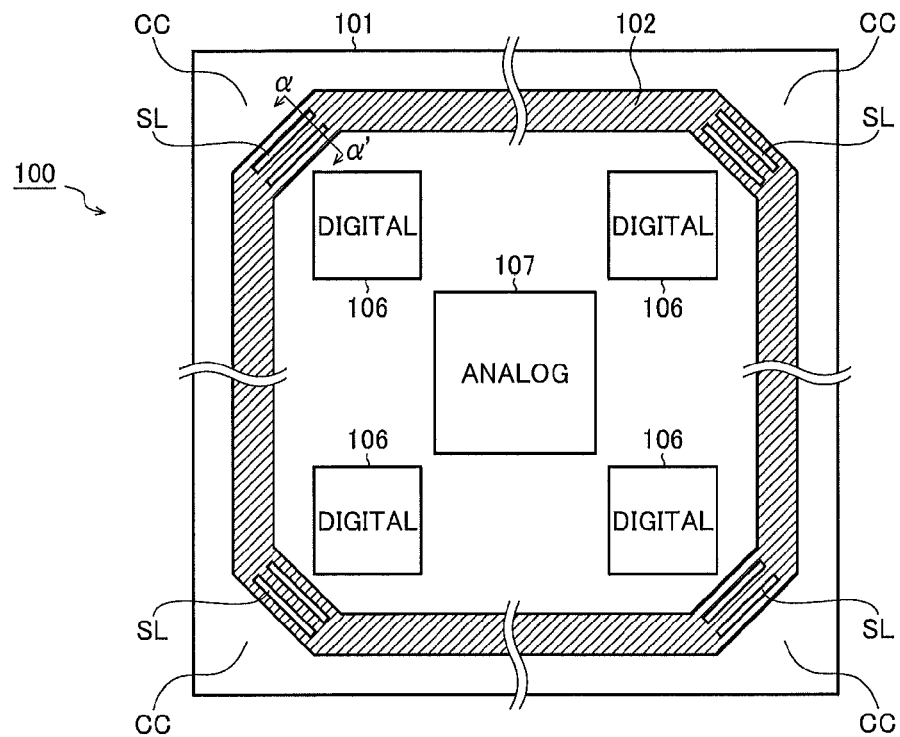
[FIG. 4A] A top view showing a semiconductor integrated circuit device according to a fourth embodiment of the present invention.
Figure 4B:
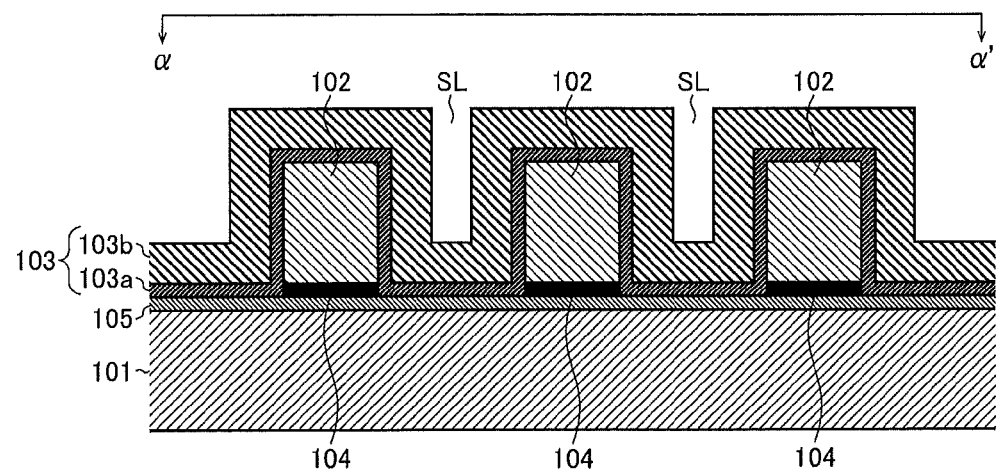
[FIG. 4B] A sectional view showing the semiconductor integrated circuit device according to the fourth embodiment of the present invention.

FIGS. 4A and 4B are a top view and a sectional view taken along line α-α', respectively, both showing a semiconductor integrated circuit device according to a fourth embodiment of the present invention.

The semiconductor integrated circuit device 100 of the fourth embodiment includes: a semiconductor substrate 101; a metal wiring layer 102; a passivation layer 103; a barrier metal layer 104; an interlayer insulating film 105; a digital circuit 106; and an analog circuit 107.

In the semiconductor substrate 101, there is formed an element forming region (impurity diffusion region), on which the interlayer insulating film 105, the barrier metal layer 104, the metal wiring layer 102, and the passivation layer 103 are stacked one over another. In the element forming region mentioned above, there are formed a plurality of digital and analog circuits 106 and 107, respectively. For example, in a case where the semiconductor integrated circuit device 100 is a display driver, the display driver is formed of the digital and analog circuits 106 and 107; in a case where the semiconductor integrated circuit device 100 is a sensor device, the sensor device is formed of the digital and analog circuits 106 and 107.

In each corner of the semiconductor substrate 101 which is cut out in a rectangular shape, there is provided a corner non-wiring region CC where no portion of the metal wiring layer 102 is formed. The advantages of the provision of the corner non-wiring region CC and the variation of the shape of the corner non-wiring region CC are as have been described above.

In the metal wiring layer 102 formed over the semiconductor substrate 101, there are formed slits SL in portions of the metal wiring layer 102 close to the four corners of the semiconductor substrate 101. This configuration helps disperse thermal stress to thereby reduce development of cracks in the passivation layer 103. In FIG. 4A, the metal wiring layer 102 is laid all along the edges of the semiconductor substrate 101, but this is not meant to limit how the metal wiring layer 102 is laid out.

The passivation layer 103, which covers the metal wiring layer 102, includes: a first passivation layer 103a which is formed on the metal wiring layer 102; and a second passivation layer 103*b* which is formed on the first passivation layer 103*a*. In particular, the first passivation layer 103*a* is made of a material that is softer than the material of which the second passivation layer 103*b* is made. More specifically, the first passivation layer 103*a* is formed of un-doped silicate glass (USG), and the second passivation layer 103*b* is formed of silicon nitride (SiN). Also, the first passivation layer 103*a* is formed thinner than the second passivation layer 103*b*. In this configuration, the first passivation layer 103*a* functions as cushioning for dispersing thermal stress, and this makes it possible to reduce development of cracks in the second passivation layer 103*b*.

In an area immediately under the metal wiring layer 102, the barrier metal layer 104 is formed. This configuration makes it possible to prevent metal diffusion to the interlayer insulating film 105.

Next, a description will be given of the circuit layout in the element forming region. In the semiconductor integrated circuit device 100 of the fourth embodiment, the digital circuit 106 (a logic circuit such as an AND gate), whose circuit characteristic is resistant to change under thermal stress, is arranged in the vicinity of each corner of semiconductor substrate 101 where thermal stress tends to concentrate. On the other hand, in the center portion of the semiconductor substrate 101, where thermal stress is less likely to concentrate, the analog circuit 107 (such as a current mirror circuit, a constant current circuit, a constant voltage circuit, a digital/analog converter circuit, and an analog/digital converter circuit in all of which the transistor pair characteristic is important), whose circuit characteristic tends to change under stress, is arranged. With this circuit layout, even if thermal stress is applied to the semiconductor substrate 101, it is possible to reduce negative effect of the thermal stress on operation of the circuits, to thereby avoid malfunction of the circuits.

With the semiconductor integrated circuit device 100 of the fourth embodiment, it is possible to adopt a combination of anti-thermal-stress measurements selected from, for example, (1) providing the corner non-wiring regions CC, (2) forming slits in the metal wiring layer 102, (3) forming the passivation layer 103 as a multilayer, and (4) optimizing the circuit layout, to thereby achieve improved reliability in a temperature cycle test.

INDUSTRIAL APPLICABILITY

The present invention offers technology that is useful for improvement of the reliability and yields of a semiconductor integrated circuit device, and can be suitably used, for example, in semiconductor integrated circuit devices incorporated in electronic devices for automobiles.

LIST OF REFERENCE NUMERALS

10 semiconductor integrated circuit device
11 semiconductor substrate
12 element forming region (impurity diffusion region)
13 metal wiring layer
13' rewiring layer
14 passivation layer
14' insulating layer
CC1-CC4 corner non-wiring regions
a corner
X, Y edges
x, y points on edges X and Y
100 semiconductor integrated circuit device
101 semiconductor substrate
102 metal wiring layer
103 passivation layer
103*a* first passivation layer
103*b* second passivation layer
104 barrier metal layer
105 interlayer insulating film
106 digital circuit
107 analog circuit
CC corner non-wiring region
SL slit

What is claimed is:

1. A semiconductor integrated circuit device, comprising:
a rectangular shaped semiconductor substrate including an active region in which one or more circuits are formed;
a metal wiring layer formed on or over the semiconductor substrate, wherein the semiconductor substrate is a silicon substrate;
a passivation layer covering the metal wiring layer; and
four corner non-wiring regions provided at a surface of the semiconductor integrated circuit device, respectively, at each of four corners of the semiconductor integrated circuit device, where no portion of the metal wiring layer is formed on the four corner non-wiring regions,
wherein each of the corner non-wiring regions is a triangular region enclosed by a first line connecting the corner of the semiconductor integrated circuit device and a first point located on an edge extending from the corner, a second line connecting the corner and a second point located on another edge extending from the corner, and a third line connecting the first point and the second point, with no portion of the metal wiring layer inside the triangular region.

2. The semiconductor integrated circuit device of claim 1, further comprising:
a barrier metal layer immediately under the metal wiring layer.

3. The semiconductor integrated circuit device of claim 2, wherein
a digital circuit which does not tend to change in circuit characteristic under stress is arranged near the corner of the semiconductor substrate, and an analog circuit which tends to change in circuit characteristic under stress is arranged at a center of the semiconductor substrate.

4. The semiconductor integrated circuit device of claim 3, wherein the digital circuit includes a logic circuit such as an AND gate.

5. The semiconductor integrated circuit device of claim 4, wherein the analog circuit includes a current mirror circuit.

6. The semiconductor integrated circuit device of claim 5, wherein one side of the semiconductor substrate is at least five times as long as another side that is perpendicular to the one side.

7. The semiconductor integrated circuit device of claim 6, wherein the semiconductor integrated circuit device is a display driver or a sensor device.

8. The semiconductor integrated circuit device of claim 1, wherein the first line and the second line each have a length of 250 μm.

9. The semiconductor integrated circuit device of claim 8, wherein a portion of the metal wiring layer is arranged straight along the third line.

10. The semiconductor integrated circuit device of claim 8, wherein a portion of the metal wiring layer is arranged in a staircase pattern along the third line.

11. The semiconductor integrated circuit device of claim 8, wherein a portion of the metal wiring layer is arranged in a wave pattern along the third line.

12. The semiconductor integrated circuit device of claim 8, wherein a portion of the metal wiring layer is arrange to be curved along a circular arc in a corner of the semiconductor substrate.

13. The semiconductor integrated circuit device of claim 5, wherein the analog circuit further includes a constant current circuit.

14. The semiconductor integrated circuit device of claim 13, wherein the analog circuit further includes a constant voltage circuit.

15. The semiconductor integrated circuit device of claim 14, wherein the analog circuit further includes a digital/analog converter circuit.

16. The semiconductor integrated circuit device of claim 15, wherein the analog circuit further includes an analog/digital converter circuit.

17. The semiconductor integrated circuit device of claim 1, further comprising an insulating layer formed under the passivation layer.

* * * * *